United States Patent
Inagaki et al.

(10) Patent No.: US 8,212,451 B2
(45) Date of Patent: Jul. 3, 2012

(54) MULTI-LAYER PIEZOELECTRIC ELEMENT HAVING A PLURALITY OF JUNCTION SECTIONS AND INJECTION APPARATUS EMPLOYING THE SAME

(75) Inventors: Masahiro Inagaki, Kirishima (JP); Takami Sakamoto, Krishima (JP); Harald-Johannes Kastl, Fichtelberg (DE); Carsten Schuh, Baldham (DE); Bernhard Doellgast, Flurweg (AT); Atsushi Ochi, Yokohama (JP)

(73) Assignees: Kyocera Corporation, Kyoto (JP); Continental Automotive GmbH, Hanover (DE)

( * ) Notice: Subject to any disclaimer, the term of this patent is extended or adjusted under 35 U.S.C. 154(b) by 474 days.

(21) Appl. No.: 12/447,640

(22) PCT Filed: Oct. 31, 2006

(86) PCT No.: PCT/JP2006/322212
§ 371 (c)(1),
(2), (4) Date: Sep. 8, 2009

(87) PCT Pub. No.: WO2008/053569
PCT Pub. Date: May 8, 2008

(65) Prior Publication Data
US 2010/0060110 A1   Mar. 11, 2010

(51) Int. Cl.
*H01L 41/083* (2006.01)
(52) U.S. Cl. ............................ 310/328; 310/366
(58) Field of Classification Search ........... 310/328, 310/366
See application file for complete search history.

(56) References Cited

U.S. PATENT DOCUMENTS

| 6,078,127 | A | 6/2000 | Saito et al. ............... 310/363 |
| 6,930,438 | B2 * | 8/2005 | Cramer et al. ............ 310/328 |
| 7,358,655 | B2 * | 4/2008 | Ragossnig et al. ........ 310/358 |
| 7,554,251 | B2 * | 6/2009 | Kondo et al. ............. 310/366 |
| 7,579,756 | B2 * | 8/2009 | Althoff et al. ............ 310/328 |
| 8,007,903 | B2 * | 8/2011 | Okamura et al. ........ 428/316.6 |
| 2006/0238073 | A1 | 10/2006 | Ragossnig et al. ........ 310/328 |
| 2008/0315717 | A1 * | 12/2008 | Schroder et al. .......... 310/311 |
| 2010/0019620 | A1 * | 1/2010 | Kastl et al. ............... 310/311 |
| 2010/0072306 | A1 * | 3/2010 | Ono ......................... 239/584 |
| 2010/0139621 | A1 * | 6/2010 | Murai et al. .............. 123/472 |
| 2010/0140379 | A1 * | 6/2010 | Suzuki et al. ............. 239/569 |
| 2010/0237751 | A1 * | 9/2010 | Bosch et al. .............. 310/366 |
| 2010/0327704 | A1 * | 12/2010 | Sakamoto et al. ........ 310/365 |
| 2011/0062830 | A1 * | 3/2011 | Schroder et al. .......... 310/366 |

FOREIGN PATENT DOCUMENTS

| DE | 1 023 478 | 8/1955 |
| DE | 103 07 825 A1 | 9/2004 |
| EP | 1 732 146 A1 | 12/2006 |
| JP | 06-181343 | 6/1994 |
| WO | WO 2005/086247 A1 | 9/2005 |

* cited by examiner

*Primary Examiner* — Jaydi San Martin
(74) *Attorney, Agent, or Firm* — DLA Piper LLP (US)

(57) ABSTRACT

A multi-layer piezoelectric element includes a stack having metal layers and piezoelectric layers stacked one on another, and a pair of external electrodes formed on the side faces of the stack. At least one of the metal layers is a stress relieving layer having partial metal layers scattered between the two piezoelectric layers and voids. Junction sections are formed between the two piezoelectric layers to join and are disposed on both sides of an imaginary straight line drawn to connect the center of width of one of the external electrodes and the center of width of the other of the external electrodes in a plane including the stress relieving perpendicular to the stacking direction.

10 Claims, 13 Drawing Sheets

MULTI-LAYER PIEZOELECTRIC ELEMENT HAVING A PLURALITY OF JUNCTION SECTIONS AND INJECTION APPARATUS EMPLOYING THE SAME

CROSS-REFERENCE TO THE RELATED APPLICATIONS

This application is a national stage of international application No. PCT/JP2006/322212 filed on Oct. 31, 2006, the entire contents of which are incorporated herein by reference.

TECHNICAL FIELD

The present invention relates to a multi-layer piezoelectric element used in, for example, fuel injection apparatus of automobile engine, liquid injection apparatus of ink jet printer or the like, precision positioning device or vibration preventing device for optical apparatus or the like, and an injection apparatus employing the same.

BACKGROUND ART

There have been known multi-layer piezoelectric elements which are used in the fuel injection apparatus of automobile engine or the like. FIG. 13(a) is a perspective view showing a multi-layer piezoelectric element of the prior art. The multi-layer piezoelectric element 101 comprises a stack 109, consisting of a plurality of piezoelectric layers 105 and a plurality of internal electrode layers (metal layers) 107, the piezoelectric layers 105 and the internal electrode layers 107 being stacked alternately one on another, and a pair of external electrodes 111 formed on the side faces of the stack 109.

The internal electrode layers 107 are not formed over the entire principal surfaces of the piezoelectric layers 105, but have the so-called partial electrode structure. FIG. 13(b) is an exploded perspective view of a part of the multi-layer piezoelectric element 101 shown in FIG. 13(a) explanatory of the partial electrode structure. As shown in FIG. 13(a) and FIG. 13(b), the internal electrode layers 107 are stacked in a staggered manner so as to be exposed alternately on the left side face of the stack 109 in one layer and then on the right side face of the stack 109 in the next layer. With this constitution, the plurality of internal electrode layers 107 are electrically connected to a pair of the external electrodes 105 in every other layer. Inactive layers 113, 113 are stacked on both end faces of the stack 109 in the direction of stacking.

DISCLOSURE OF THE INVENTION

As shown in FIG. 13(a) and FIG. 13(b), the multi-layer piezoelectric element having the partial electrode structure has an active region A where the internal electrode layers 107 of different polarities oppose each other via the piezoelectric layer 105, and an inactive region B where internal electrode layers 107 of different polarities do not oppose each other via the piezoelectric layer 105. Therefore, when the multi-layer piezoelectric element is driven, since only the active region A undergoes displacement while the inactive region B does not, stress is concentrated in the interface between the active region A and the inactive region B, which may become the start point of the growth of crack.

Also as shown in FIG. 13(a), the multi-layer piezoelectric element 101 has the inactive layers 113 stacked on both end faces thereof in the direction of stacking. When the multi-layer piezoelectric element 101 is driven, since the inactive layers 113 do not undergo displacement, stress is concentrated in the interface between a region undergoing displacement and the inactive layers 113, which may become the start point of the growth of crack.

The crack described above may develop from the interface toward a side face (on the inactive region B side) of the stack 109, but may also develop toward the inside (on the active region A side) of the stack 109. When an electric field is generated in the space between the opposing internal electrode layers 107, the active region A expands in the direction of the electric field due to the reverse piezoelectric effect, and shrinking displacement occurs in a plane perpendicular to the expansion. When the piezoelectric layers 105 expand in the direction of the electric field, the entire element 101 expands in the direction of stacking. In case the element 101 is housed in a case or frame that constrains the expansion, a compressive stress is generated as a reaction thereto in the element 101.

A crack which has started in the interface and grown toward the active region A may develop in the direction of thickness of the piezoelectric layers 105 while deflecting or branching depending on the state of the stress. When a crack which develops in the direction of thickness of the piezoelectric layers 105 occurs in a space between the internal electrode layers 107 which oppose each other, short-circuiting may take place between the internal electrode layers 107 and make the amount of displacement of the multi-layer piezoelectric element 101 smaller.

Moreover, as the multi-layer piezoelectric element becomes smaller in size and is required to make larger amount of displacement under a higher pressure in recent years, it has been subjected to higher electric field. There is further requirement for the multi-layer piezoelectric element to endure continuous operation over a long period of time. To meet these requirements, such a multi-layer piezoelectric element is proposed that has stress relieving layer provided inside thereof (refer to, for example, DE10234787A1 and DE10307825A1). However, the multi-layer piezoelectric element of the prior art having the stress relieving layer does not necessarily have sufficient durability to endure the conditions of continuous operation under a high pressure over a long period of time.

An object of the present invention is to provide a multi-layer piezoelectric element and an injection apparatus which undergo less change in the amount of displacement and shows high durability during continuous operation under a high voltage and a high pressure over a long period of time.

The multi-layer piezoelectric element of the present invention comprises a stack having a plurality of metal layers and a plurality of piezoelectric layers which are stacked one on another, and a pair of external electrodes formed on the side faces of the stack, wherein at least one of the plurality of metal layers is stress relieving layer which consists of a plurality of partial metal layers that are scattered between two piezoelectric layers which adjoin the metal layers in the direction of stacking and voids, and wherein a plurality of junction sections are formed between said two piezoelectric layers to join said two piezoelectric layers with each other, the junction sections being disposed on both sides of an imaginary straight line which is drawn so as to connect the center in the direction of width of one of the external electrodes and the center in the direction of width of the other of the external electrodes in a plane that includes the stress relieving layer and is perpendicular to the stacking direction.

The pair of external electrodes are preferably disposed at the position where the plane is divided into two equal parts by the imaginary straight line. The junction sections are preferably disposed on a straight line which is perpendicular to the imaginary straight line and passes the center of the imaginary straight line, and the junction sections are more preferably disposed along the side faces of the stack. Plural partial metal layers are preferably separated by the voids so as to be electrically insulated from each other. The stress relieving layer is preferably disposed in plurality in the stacking direction of the stack. Plural stress relieving layers are preferably disposed via a plurality of piezoelectric layers. The plurality of stress relieving layer are more preferably disposed in regular arrangement in the stacking direction of the stack. The stress relieving layer is preferably constituted mainly from silver.

The injection apparatus of the present invention comprises a container which has an injection hole and the multi-layer piezoelectric element described above, having such a constitution as a liquid held in the container is discharged from the injection hole by the operation of the multi-layer piezoelectric element.

According to the multi-layer piezoelectric element of the present invention, since at least one of the plurality of metal layers is the stress relieving layer which consists of a plurality of the partial metal layers that are scattered between two piezoelectric layers which adjoin the metal layers in the direction of stacking and the voids, cracks can be prevented from growing in the direction of thickness of the piezoelectric layer. Specifically, since the stress relieving layer consisting of the plurality of the partial metal layers and the voids has a lower strength of bonding with the piezoelectric layer than other metal layers, stress generated in the element causes peeling to start in a peel-off section and proceed along the interface between the stress relieving layer and the piezoelectric layer that adjoins therewith. As a result, cracks can be prevented from growing in the direction of thickness of the piezoelectric layer, so that the amount of displacement of the element can be suppressed from changing.

Also according to the multi-layer piezoelectric element of the present invention, since a plurality of junction sections are formed between two piezoelectric layers which adjoin the stress relieving layers on both sides in the direction of stacking so as to join the piezoelectric layers with each other, the distance between two piezoelectric layers which adjoin the stress relieving layers on both sides in the direction of stacking can be suppressed from changing significantly during operation of the element. This improves the accuracy of the distance of displacement of the element. Specifically, since the stress relieving layer has a lower strength of bonding with the two piezoelectric layers which adjoin in the stacking direction, the distance between the two piezoelectric layers tends to change during operation of the element, although the junction section disposed between the two piezoelectric layers where the stress relieving layer exists act to join together and support the piezoelectric layers. As a result, the distance between the two piezoelectric layers can be suppressed from changing significantly during operation of the element.

Moreover, according to the multi-layer piezoelectric element of the present invention, when the stress relieving layer is divided into two regions by an imaginary straight line connecting the center in the direction of width of one of the external electrodes and the center in the direction of width of the other external electrode in a plane that includes the stress relieving layer and is perpendicular to the stacking direction, then at least one of the junction sections is disposed in the two regions. Therefore, joining function of the junction sections can be prevented from acting unevenly among the two piezoelectric layers, while increasing the synergy effect with the function of the external electrodes to link between the piezoelectric layers. This is because the external electrodes are formed on the side faces of the stack, and therefore serve to hold the plurality of piezoelectric layers of the stack together. Thus the function of the external electrodes to link and hold the plurality of piezoelectric layers and the function of the junction section to join the two piezoelectric layers can be achieved in a balanced manner, by disposing the junction sections in the two regions which are divided by taking reference to the pair of external electrodes.

DESCRIPTION OF REFERENCE NUMERALS

Figure 1A:
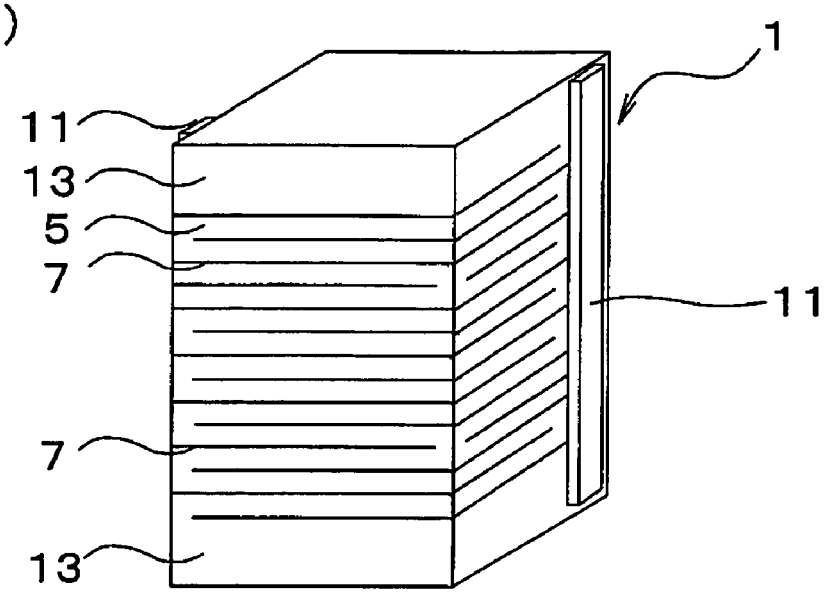
FIG. 1(a) is a perspective view showing the multi-layer piezoelectric element according to one embodiment of the present invention.

1: multi-layer piezoelectric element
5: piezoelectric layer
5a: junction section
7: metal layer
7a: internal electrode layer
7b: stress relieving layer
9: stack
11: external electrode
13: inactive layer
17: filling material
19: no-electrode section
31: container
33: injection hole
35: valve
37: fuel passage
39: cylinder
41: piston
71: partial metal layer (metal particles)
72: void

BEST MODE FOR CARRYING OUT THE INVENTION

<Multi-Layer Piezoelectric Element>

Figure 1B:
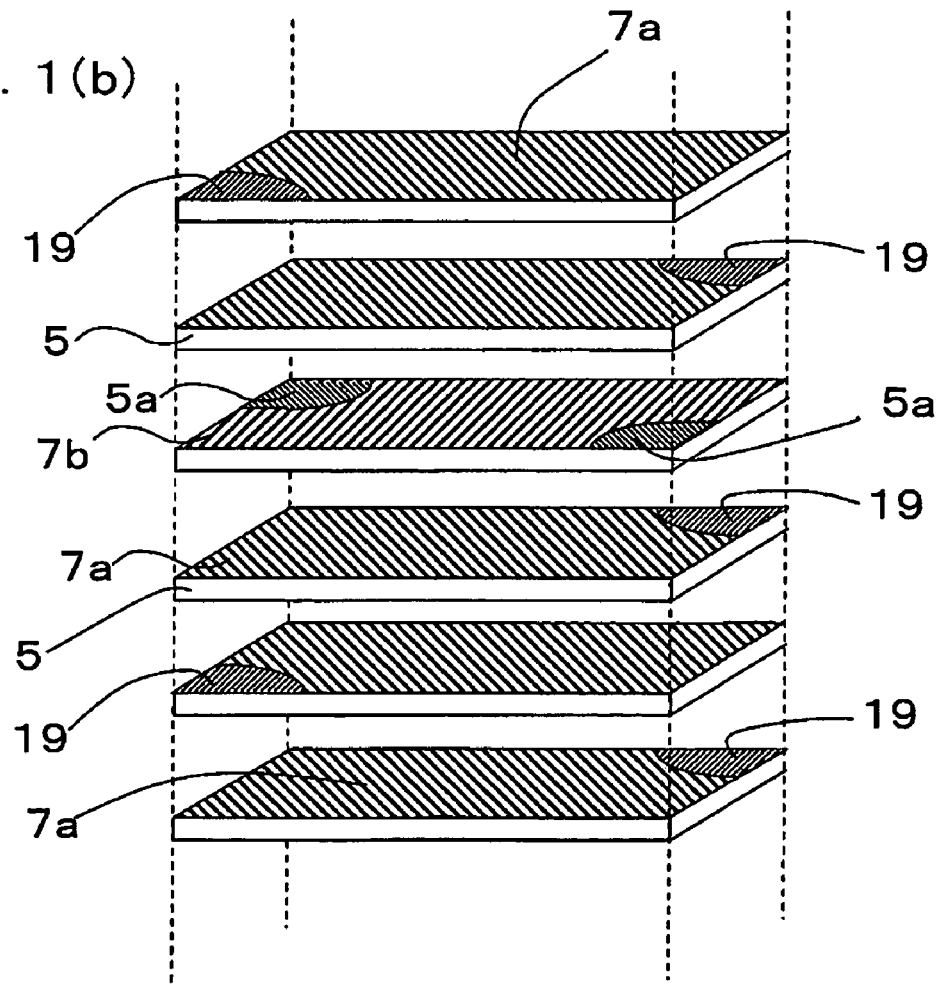
FIG. 1(b) is an exploded perspective view of a part of the multi-layer piezoelectric element explanatory of the internal structure of the multi-layer piezoelectric element shown in FIG. 1(a).
Figure 2:
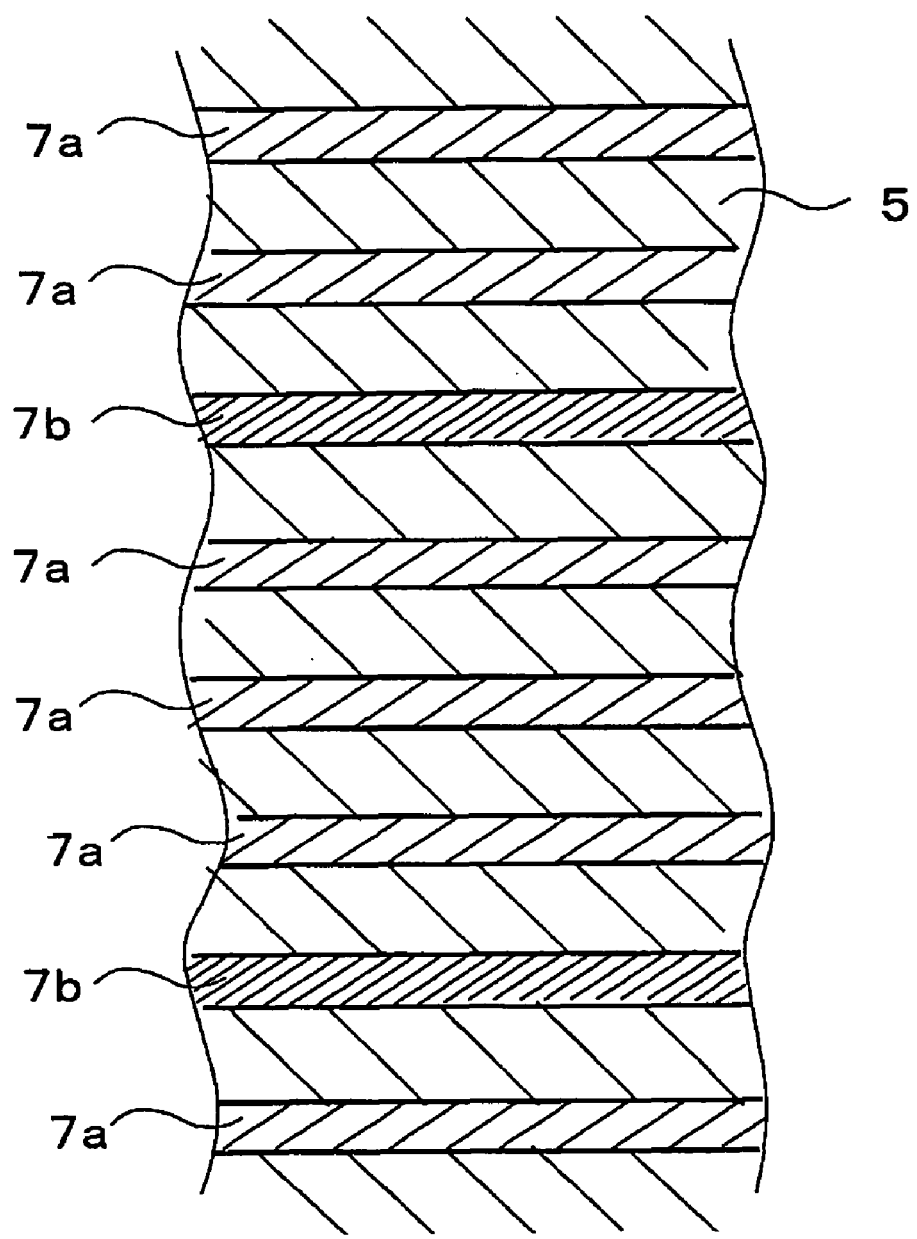
FIG. 2 is an enlarged sectional view of a part of the multi-layer piezoelectric element shown in FIG. 1.
Figure 3:
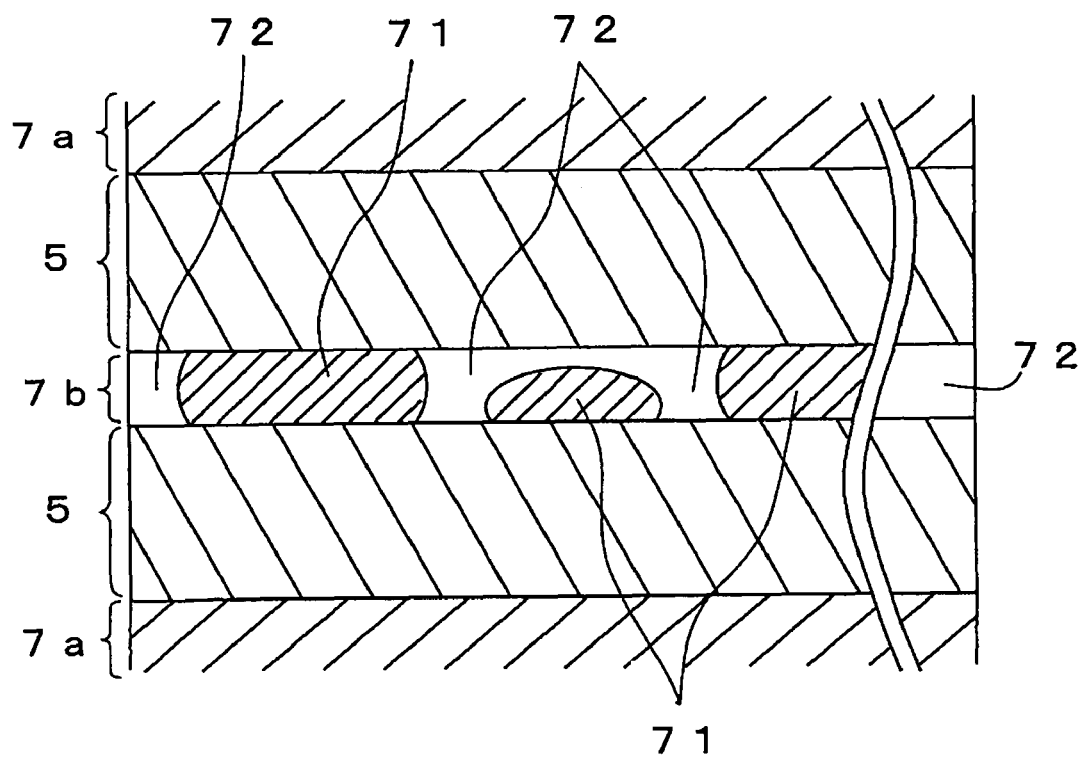
FIG. 3 is a sectional view of FIG. 2 further enlarged.

The multi-layer piezoelectric element according to one embodiment of the present invention will now be described in detail with reference to the accompanying drawings. FIG. 1(a) is a perspective view showing the multi-layer piezoelectric element 1 according to this embodiment, and FIG. 1(b) is an exploded perspective view of a part of the multi-layer piezoelectric element 1 explanatory of the internal structure of the multi-layer piezoelectric element 1 shown in FIG. 1(a). FIG. 2 is an enlarged sectional view of a part of the multi-layer piezoelectric element 1 according to this embodiment. FIG. 3 is a sectional view showing the stress relieving layer shown in FIG. 2 in further enlargement.

As shown in FIG. 1(a) and FIG. 1(b), the multi-layer piezoelectric element 1 comprises a stack 9 consisting of a plurality of piezoelectric layers 5 and a plurality of metal layers 7, the piezoelectric layers 5 and the metal layers 7 being stacked one on another. Inactive layers 13, 13 made of piezoelectric material are formed on both ends in the stacking direction of the stack 9. A pair of external electrodes 11, 11 are formed on the opposing side faces of the stack 9.

The pair of external electrodes 11 are connected with lead wires (not shown) by soldering. The lead wires are connected to an external power source (not shown). The plurality of metal layers 7 consist of the internal electrode layers 7a which function as the internal electrodes and the stress relieving layers 7b which have the stress relieving function. When a predetermined voltage is applied from the external power source through the lead wires between the adjacent internal electrode layers 7a, the piezoelectric layers 5 undergo displacement due to the reverse piezoelectric effect. The inactive layers 13 do not undergo displacement even when a voltage is applied since the internal electrode layer 7a is provided only on one of the principal surface without the internal electrode layer provided on the other principal surface.

The internal electrode layer 7a is not formed over the entire principal surface of the piezoelectric layers 5, but is formed in the so-called partial electrode structure (refer to FIG. 1(b)). In other words, a no-electrode section 19 exists where the internal electrode layer 7a is not formed on the principal surface of the piezoelectric layers 5. The plurality of the internal electrode layers 7a having the partial electrode structure are disposed so as to be exposed alternately on the opposing side faces of the stack 9. In this constitution, the internal electrode layers 7a are electrically connected alternately to the pair of external electrodes 11, 11. In this embodiment, the pair of external electrodes 11, 11 are formed on two opposing side faces of the stack 9, but may also be formed on adjacent side faces.

At least one of the plurality of metal layers 7 is the stress relieving layer 7b. As shown in FIG. 3, the stress relieving layer 7b consists mainly of a plurality of partial metal layers (metal particles) 71 that are scattered between the two piezoelectric layers 5, 5 adjoining in the direction of stacking, and the voids 72. The plurality of partial metal layers 71 are preferably separated by the voids 72, so as to be electrically insulated from each other. When the plurality of partial metal layers 71 are separated from each other by the voids 72 in this way, the stress relieving layer 7b does not function as the internal electrode and therefore does not short-circuit the external electrodes 11, 11 of opposite polarities.

When the stress relieving layer 7b consists of the metal and the voids as described above, both the metal and the voids can deform under a stress, and therefore the multi-layer piezoelectric element having high durability can be obtained. In case the stress relieving layer 7b consists of the plurality of partial metal layers 71 which are disposed in the state of being isolated from each other by the voids 72, a part of the piezoelectric layers 5 adjacent to the stress relieving layer 7b, which faces the voids 72, does not undergo displacement even when a voltage is applied to the element 1. Therefore, the piezoelectric layers 5 which are in contact with the stress relieving layer 7b undergoes smaller amount of displacement so that concentration of stress of the element at a point can be avoided. On the other hand, the portion of the piezoelectric layer 5 which faces the voids 72 can deform easily, and is likely to deform under a stress during operation so as to provide a better effect of mitigating the stress (stress relieving effect of the piezoelectric layer).

Void ratio in the stress relieving layer 7b is preferably in a range from 20% to 90%. In order to ensure durability and stress relieving effect at the same time, void ratio is more preferably in a range from 40% to 90%, and furthermore preferably from 60% to 85%. By setting the void ratio to 20% or more, it is made possible to prevent the force of the stress relieving layer 7b to constrain the piezoelectric layer 5 from increasing, so that generation of internal stress can be suppressed as the amount of displacement of the element 1 increases. By setting the void ratio to 90% or less, it is made possible to suppress the strength of the stress relieving layer 7b from decreasing.

Void ratio in the internal electrode layer 7a is preferably in a range from 5% to 70%, more preferably from 7% to 70%, and furthermore preferably from 10% to 60%. By controlling the void ratio within this range, it is made possible to allow the piezoelectric layers 5 to deform smoothly and maintain sufficient electrical conductivity, and therefore the amount of displacement of the multi-layer piezoelectric element 1 can be suppressed from decreasing. By setting the void ratio in the internal electrode layer 7a to 5% or more, it is made possible to prevent the force of the internal electrode layer 7a to constrain the piezoelectric layer 5 from becoming excessively high. By setting the void ratio in the internal electrode layer 7a within 70%, it is made possible to prevent a part of the metal that constitutes the internal electrode layer 7a from becoming extremely thin or being isolated. Thus it is made possible to maintain sufficient electrical conductivity of the internal electrode layer 7a and prevent the strength of the internal electrode layer 7a from decreasing.

Void ratio can be determined by observing a section of the multi-layer piezoelectric element 1 cut in the direction of stacking. Specifically, the area of the voids 72 included in the stress relieving layer 7b in the section of the element 1 is measured, and the total area of the voids 72 is divided by the area of the entire stress relieving layer 7b, with the division multiplied by 100. The void ratio may be determined, for example, by applying a known technique of image processing to an image obtained by means of a scanning electron microscope (SEM).

Also as the voids 72 exist between the partial metal layers 71, the stress relieving layer 7b and the piezoelectric layer 5 can be prevented from coming apart from each other at once throughout the entire interface therebetween. Moreover, since the metal that constitutes the partial metal layer 71 is softer than the piezoelectric material particles that constitute the piezoelectric layer 5, the partial metal layer 71 has higher effect of relieving the stress than the piezoelectric layer. The voids 72 also have the effect of cushioning. As a result, the multi-layer piezoelectric element having high stress relieving effect and very high durability can be obtained.

The reason why the effects described above are achieved is supposedly as follows. When the multi-layer piezoelectric element 1 is driven and a stress is generated in the multi-layer piezoelectric element 1, the stress tends to be concentrated in the stress relieving layer 7b which has the lowest strength. Bonding strength between the piezoelectric material particles and the metal particles which are made of different materials is lower than the bonding strength between the piezoelectric material particles and the bonding strength between the metal particles. Also the stress relieving layer 7b consisting of a plurality of the partial metal layers 71 has smaller area of bonding with the piezoelectric layer 5 in comparison to other internal electrode layers 7a. As a result, the bonding strength between the stress relieving layer 7b and the piezoelectric layer 5 is less than the bonding strength between the internal electrode layer 7a and the piezoelectric layer 5. Therefore, when the stress is generated in the element 1, stress is likely to be concentrated between the scattered partial metal layers 71 and the piezoelectric layer 5. When the stress relieving layer 7b is subjected to the stress, the partial metal layers 71 peel off the piezoelectric layer 5 successively so as to mitigate the stress.

Also because the plurality of partial metal layers 71 are scattered between the piezoelectric layers 5, 5, the stress relieving layer 7b does not function as the internal electrode. Therefore, the amount of displacement of the element 1 does not change even when the peel-off of the stress relieving layer 7b from the piezoelectric layer 5 proceeds in the interface therebetween, and therefore stable displacement can be maintained over a long period of time.

Figure 4A:
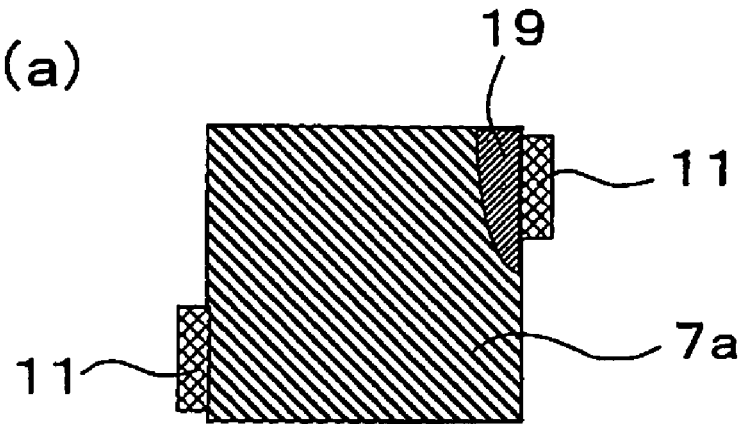
FIG. 4(a) is a sectional view in a plane including the internal electrode layer which adjoin on one side of the stacking direction of the stress relieving layer in the embodiment shown in FIG. 1.
Figure 4B:
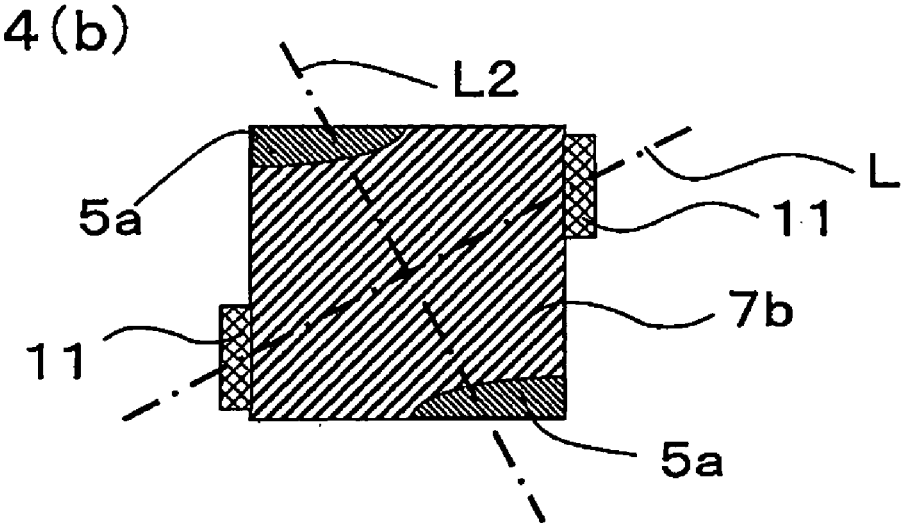
FIG. 4(b) is a sectional view in a plane which includes the stress relieving layer in this embodiment.
Figure 4C:
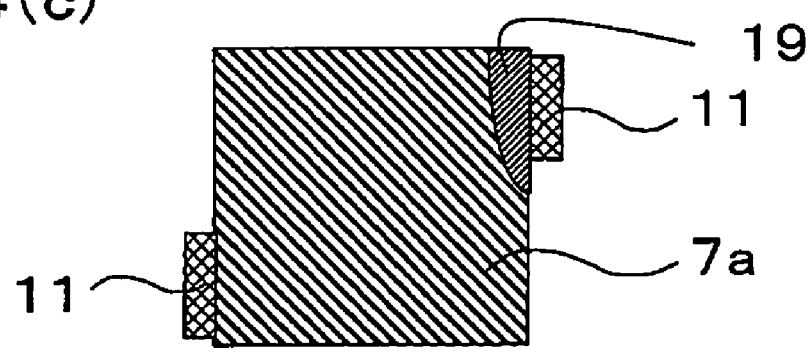
FIG. 4(c) is a sectional view in a plane which includes the internal electrode layer which adjoins on the other side of the stacking direction of the stress relieving layer in this embodiment.

As shown in FIG. 1(b), the multi-layer piezoelectric element 1 of this embodiment has two junction sections 5a formed between two piezoelectric layers 5, 5 which adjoin the stress relieving layers 7b on both sides in the direction of stacking so as to join the piezoelectric layers 5, 5 with each other FIG. 4(a) is a sectional view in a plane including the internal electrode layer 7a which adjoin on one side of the stacking direction of the stress relieving layer 7b in this embodiment, FIG. 4(b) is a sectional view in a plane which includes the stress relieving layer 7b in this embodiment, and FIG. 4(c) is a sectional view in a plane which includes the internal electrode layer 7a which adjoin on the other side of the stacking direction of the stress relieving layer 7b in this embodiment.

As shown in FIG. 1(b) and FIG. 4(b), when the stress relieving layer 7b is divided into two regions by an imaginary straight line L which connects the center in the direction of width of one of the external electrodes 11 and the center in the direction of width of the other external electrode 11 in a plane that includes the stress relieving layer 7b and is perpendicular to the stacking direction, the junction sections 5a, 5a are disposed in the two regions.

Since the stress relieving layer 7b as described above is provided between the piezoelectric layers 5, 5 so as to mitigate the stress, the stress generated during operation is concentrated in the stress relieving layer 7b which has lower strength, so that peel-off occurs between the stress relieving layer 7b and the piezoelectric layer 5. In the element of the prior art which has the stress relieving layer of lower density provided in the piezoelectric layers 5, cracks that penetrate the piezoelectric layer in the stacking direction tend to be generated. In the element 1 of this embodiment, since generation of such cracks can be prevented from occurring, it is made possible to prevent the internal electrode layers 7a, 7a of different polarities from short-circuiting each other and improve the durability.

Also because the junction sections 5a, 5a are disposed in the two regions divided by the imaginary straight line L, the junction sections 5a, 5a support the piezoelectric layers 5, 5 in well-balanced manner. Also the junction sections 5a, 5a maintain the distance between the piezoelectric layers 5, 5 in the region where the external electrodes 11, 11 are not provided. Therefore, distance of displacement of the element can be maintained constant without variation in the distance between the piezoelectric layers 5, 5 during operation. As a result, the multi-layer piezoelectric element 1 of this embodiment not only is capable of increasing the amount of displacement, but also achieves high durability during continuous operation over an extended period of time.

When the multi-layer piezoelectric element is subjected to a transient surge voltage due to a noise in the power source, or the multi-layer piezoelectric element is operated continuously over a long period of time under conditions of high temperature, high humidity, high electric field and a high pressure, peel-off occurs only in the interface between the partial metal layer 71 of the stress relieving layer 7b and the piezoelectric layer 5, so that the junction sections 5a firmly holds the piezoelectric layer 5, 5 together and maintains the strength of the multi-layer piezoelectric element 1. Thus multi-layer piezoelectric element 1 not only experiences small change in the amount of displacement but also ensures high reliability even when the multi-layer piezoelectric element 1 is subjected to a transient surge voltage due to a noise in the power source, or the multi-layer piezoelectric element is operated continuously over a long period of time under conditions of high temperature, high humidity, high electric field and a high pressure.

Moreover, the external electrodes 11 serve to firmly hold the piezoelectric layer 5 together on the side faces of the element where the external electrodes 11 are provided. The pair of external electrodes 11 are preferably disposed at the position where the plane is divided into two equal parts by the imaginary straight line that connects the centers. When the pair of external electrodes 11, 11 are disposed at positions which are symmetrical with respect to the center of gravity of the stack 9, the stress acting on the pair of external electrodes 11 can be uniformly distributed, so as to make stable multi-layer piezoelectric element of which center of gravity does not fluctuate. In addition, since junction sections 5a, 5a are disposed in the two regions which are the space between the piezoelectric layers 5, 5 divided into two parts, the piezoelectric layers 5, 5 can be joined together in well-balanced manner.

As shown in FIG. 4(b), it is preferable that junction sections 5a, 5a are disposed on a straight line L2 which is perpendicular to the imaginary straight line L and passes the center of the imaginary straight line L. In this configuration, the intersect between the straight line which connects the pair of external electrodes 11, 11 and the straight line which connects the two junction sections 5a, 5a lies substantially at the center of gravity in the space between the piezoelectric layers 5, 5. This improves the balance between the function of the external electrodes 11 to link and hold the plurality of piezoelectric layers 5 and the function of the junction section 5a to join the piezoelectric layers 5, 5 together, thereby making it possible to join the piezoelectric layers 5, 5 together and support more evenly and stably. Thus it is made possible to prevent such a crack from occurring that penetrates the piezoelectric layer 5 and causes short-circuiting of the internal electrode layers 7a of different polarities, and maintain the distance between the piezoelectric layers 5, 5 substantially uniform even in the portion where the external electrode 11 is not formed. This makes it possible to maintain the distance of displacement of the element constant without fluctuation of the distance between the piezoelectric layers 5, 5 during operation.

Further as shown in FIG. 4(b), it is preferable that the junction sections 5a, 5a are formed along the side face of the stack 9. The external electrodes 11, 11 are formed on the side faces of the stack 9 and link and hold the plurality of piezoelectric layers 5 on the side face of the stack 9. On the other hand, as the junction sections 5a are formed along the side face of the stack 9, the junction sections 5a, 5a which are formed in the two regions join the piezoelectric layers 5, 5 together near the side face of the stack 9. As a result, the external electrodes 11, 11 and the junction sections 5a, 5a join the piezoelectric layers 5, 5 together near the side face of the stack 9, so that uniform and well-balanced junction between the piezoelectric layers 5, 5 is achieved. Also because the stress acting on the element 1 tends to be concentrated in the surface of the element 1 on the side face thereof, peel-off in the interface between the stress relieving layer 7b and the piezoelectric layer 5 is likely to start in the side face of the element 1.

When the stress relieving layer 7b is formed between the junction sections 5a and the side face of the stack 9, for example, peel-off (crack) that has grown in the interface between the stress relieving layer 7b and the piezoelectric layers 5 stops at a portion in contact with the junction sections 5a. When the junction sections 5a is formed along the side face, on the other hand, peel-off that has grown in the interface between the stress relieving layer 7b and the piezoelectric layers 5 is not likely to stop at the junction sections 5a, thus resulting in higher effect of mitigating the stress. Also when the stress relieving layer 7b is exposed on all of the four side faces of the stack 9, the stress can be mitigated regardless of the direction in which the stress acts on the multi-layer piezoelectric element 1.

Even when all the partial metal layers 71 in the stress relieving layer 7b have peeled off the piezoelectric layer 5 after long period of operation, the element does not break up since the junction section 5a exists between the piezoelectric layers 5, 5. In addition, the stress relieving layer 7b with all the partial metal layers 71 of which have peeled off has smaller force to constrain the relative movement between the piezoelectric layers 5 provided to adjoin therewith on both sides in the stacking direction, thus allowing the relative movement between the piezoelectric layers 5, so as to remain functional as the stress relieving layer.

Existence of the voids 72 causes the piezoelectric layer 5 to be partially clamped when the multi-layer piezoelectric element 1 undergoes piezoelectric displacement. This makes the force that constraints the piezoelectric layer 5 smaller than in the case where the metal layer 7 clamps the piezoelectric layer 5 over the entire surface thereof. This makes it easier for the piezoelectric layer 5 to undergo displacement, with greater amount of displacement. As a result, the amount of displacement becomes larger and the durability is improved.

The stress relieving layer 7b is preferably disposed in plurality in the stacking direction of the element 1. This constitution enables it to disperse the stress generated in the element 1 over a plurality of positions, so as to further improve the durability. In this case, plural stress relieving layers 7b are preferably disposed via a plurality of the piezoelectric layers 5. This is because disposing the stress relieving layers 7b continuously in the element 1 causes the stress generated in the element 1 to be concentrated in the stress relieving layer 7b which is formed continuously. When the plurality of the stress relieving layers 7b are disposed via a plurality of the piezoelectric layers 5, in contrast, stress generated in the element 1 can be effectively distributed in the stacking direction. The plurality of the stress relieving layers 7b are more preferably disposed in a regular arrangement in the stacking direction of the element 1, which leads to uniform distribution of stress in the stacking direction of the element 1.

The stack 9 has preferably a shape of prism having polygonal cross section. This is because, in case the stack 9 has a cylindrical shape, layers formed in a shape of true circle with high precision must be stacked since deviation from true circle results in misalignment of the central axis. Thus it is difficult to employ a manufacturing method designed for mass production based on fire-at-once process. Layers formed in substantially circular shape may be stacked and, after being fired in case it is preferable, ground on the circumference into cylindrical shape. But this process makes it difficult to align the center axes of the metal layers 7 with high precision. Polygonal prism configuration, in contrast, enables it to form the metal layers 7 on the piezoelectric layer 5 having a predetermined datum line, and stack the layers in alignment with the datum line. As a result, the center axis can be formed as the axis of operation by a manufacturing method designed for mass production so as to make a device having high durability.

The stress relieving layers 7b are preferably constituted mainly from silver. With this constitution, the stress relieving layers 7b can be fired together with the piezoelectric layer 5 at the same time. Moreover, since silver has high heat conductivity, heat can be dissipated efficiently even when local heating occurs in a part of the element 1 due to stress concentration. Also because the stress relieving layers 7b are constituted mainly from silver, the partial metal layers 71 without oxide film formed thereon can be formed. Thus, since the partial metal layers 71 having high flexibility can be formed, the effect of relieving stress is improved. The stress relieving layers 7b may be formed, for example, from silver-palladium alloy. The internal electrode layer 7a may be formed, for example, from silver-palladium alloy.

In this embodiment, it is preferable that such a metal compound is included in the metal layer 7 as the main component that proportion M1 (% by weight) of palladium and proportion M2 (% by weight) of silver in the metal layer 7 (the internal electrode layer 7a and the stress relieving layers 7b) satisfy relations of $0<M1\leq15$, $85\leq M2<100$ and $M1+M2=100$. This is because a proportion of palladium higher than 15% by weight results in high specific resistance of the metal layer which makes the metal layer 7 more likely to generate heat when the multi-layer piezoelectric element 1 is operated continuously, while the heat affects the piezoelectric layer 5 which has temperature dependency, thus deteriorating the displacement characteristic. As a result, the amount of displacement of the multi-layer piezoelectric element 1 may decrease.

When the external electrodes 11 are formed, the external electrode 11 and the metal layer 7 are joined together through mutual diffusion of metallic components between these members. In case the proportion of palladium in the metal layer 7 is higher than 15% by weight, hardness of the portion of the external electrode 11 where the component of the metal layer is diffused may become higher, thus resulting in lower durability of the multi-layer piezoelectric element 1 that undergoes dimensional change during operation.

In order to suppress silver included in the metal layer 7 from migrating into the piezoelectric layers 5, it is preferable to control the proportion of palladium in a range from 0.001 to 15% by weight. In order to improve the durability of the multi-layer piezoelectric element 1, proportion of palladium is preferably in a range from 0.1 to 10% by weight. When high heat conductivity and high durability are required, proportion of palladium is preferably in a range from 0.5 to 9.5% by weight. When even higher durability is required, proportion of palladium is more preferably in a range from 2 to 8% by weight.

When the proportion of silver in the metal layer 7 is less than 85% by weight, specific resistance of the metal layer 7 becomes higher. This may lead to a significant amount of heat generated from the metal layer 7 during continuous operation of the multi-layer piezoelectric element 1. In order to suppress silver included in the metal layer 7 from migrating into the piezoelectric layers 5, it is preferable to control the proportion of silver in the metal layer 7 in a range from 85 to 99.999% by weight. In order to improve the durability of the multi-layer piezoelectric element 1, proportion of silver is preferably in a range from 90 to 99.9% by weight. When higher durability is required, proportion of silver is preferably in a range from 90.5 to 99.5% by weight. When even higher durability is required, proportion of silver is more preferably in a range from 92 to 98% by weight.

Compositions of the stress relieving layers 7b and the internal electrode layer 7a may be determined as follows. The stack 9 is cut off along the interface between the stress relieving layers 7b and the piezoelectric layer 5 so as to expose the stress relieving layers 7b, and a part of the stress relieving layers 7b is sampled. The sample of the stress relieving layers 7b is subjected to chemical analysis such as ICP (induction coupled plasma) emission analysis, so as to determine the composition. A section of the multi-layer piezoelectric element 1 cut in the stacking direction may also be analyzed by a method such as EPMA (Electron Probe Micro Analysis). Observation of the metal layer in a section of the multi-layer piezoelectric element 1 under an SEM (scanning electron microscope) or a metallurgical microscope may reveal the existence of non-metallic component such as voids 72 and/or metal components such as ceramics. In such a case, too, the composition in a region other than the voids 72 may be analyzed by EPMA or the like.

It is preferable that the piezoelectric layer 5 includes perovskite type oxide as the main component. When the piezoelectric layer 5 is formed from perovskite type piezoelectric ceramic material such as barium titanate ($BaTiO_3$), for example, it has high piezoelectric strain constant $d_{33}$ which enables it to increase the amount of displacement, and also enables the piezoelectric layer 5 and the metal layer 7 to be fired at the same time. It is also preferable that the piezoelectric layer 5 includes perovskite type oxide consisting of lead titanate zirconate ($PbZrO_3$—$PbTiO_3$), that has a relatively high value of piezoelectric strain constant $d_{33}$, as the main component.

A method for manufacturing the piezoelectric actuator unit of the present invention will now be described. A method for manufacturing the multi-layer piezoelectric element 1 will first be described. First, a calcined powder of a piezoelectric ceramic material constituted from perovskite type oxide consisting of $PbZrO_3$—$PbTiO_3$ or the like, a binder made of an organic polymer such as acrylic resin or butyral resin and a plasticizer such as DBP (dibutyl phthalate) or DOP (dioctyl phthalate) are mixed so as to form a slurry. The slurry is formed into ceramic green sheets, which would become the piezoelectric layers 5, by a known method such as doctor blade process or calender roll process or other tape molding method.

Then a metal powder such as silver-palladium that constitutes the metal layer 7, a binder and a plasticizer are mixed to prepare an electrically conductive paste which is applied onto the top surface of the green sheets by screen printing method or the like to a thickness of 1 to 40 μm.

In the portion where the stress relieving layers 7b is to be formed, an electrically conductive paste prepared by adding resin beads such as acrylic beads to a metal powder such as silver-palladium, and mixing a binder, a plasticizer, etc. therewith may be printed. Alternatively, the electrically conductive paste may also be printed after forming a dot pattern, so that the partial metal layers 71 which have been sintered are constituted from metal particles isolated from each other by the voids 72, for the purpose of insulation. Also such a process may be employed as a dot pattern of silver is formed by thin film forming technology such as sputtering, an electrically conductive paste is printed thereon and plurality of the partial metal layers 71 are formed through nucleation of the metal particles during sintering. The stress relieving layers 7b may also be formed by printing an electrically conductive paste including a metal powder such as silver-palladium with the proportion of silver set higher than that in the electrically conductive paste used for the internal electrode 7a, so as to cause the silver to diffuse by the effect of the gradient of concentration formed by the difference in the concentration of silver between the metal layers during firing, so that the plurality of partial metal layers 71 are isolated from each other by the voids 72, for the purpose of insulation. In this case, the metal powder may also be a mixture of silver powder and palladium powder of controlled proportions, rather than the powder of silver-palladium alloy. Silver powder or palladium powder may also be added to the powder of silver-palladium alloy, with the composition of the mixture being controlled thereafter. It is preferable to use alloy powders of compositions controlled separately, in order to make uniform dispersion of the metals in the paste and uniform composition within the same plane of the internal electrode layers 7a and the stress relieving layer 7b.

Portions where the electrically conductive paste is not printed are secured in the surface of the ceramic green sheet where the electrically conductive paste is printed to form the stress relieving layer 7b, in order to form the junction sections 5a, 5a at the positions described above.

A plurality of the green sheets having the electrically conductive paste printed thereon are stacked one on another in the desired arrangement, and the stack is heated at a predetermined temperature to remove the binder. The stack is then fired at a temperature in a range from 900 to 1200° C. thereby to make the stack 9.

When the metal powder such as silver-palladium that constitutes the metal layer 7 is added to the green sheet that forms the inactive layer 13, or a slurry consisting of the metal powder such as silver-palladium that constitutes the metal layer 7, an inorganic compound, a binder and a plasticizer is printed on the green sheets when the green sheets that form the inactive layer 13 are stacked, shrinking behavior and shrinking rate can be matched between the inactive layer 13 and the other portions during sintering, thus making it possible to form the stack 9 of high density.

The method of making the stack 9 is not limited to that described above, and any manufacturing method may be employed as long as the stack 9 can be made in such a constitution as a plurality of the piezoelectric layers 5 and a plurality of the metal layers 7 are stacked alternately one on another.

Then an electrically conductive silver-glass paste is prepared by adding a binder to a glass powder, and the paste is printed on the external electrode forming surface of the stack 9, and the stack is baked at a temperature that is higher than the softening point of the glass and is not higher than the melting point of silver (965° C.). Thus the external electrode 11 is formed from the electrically conductive silver-glass paste.

At this time, the paste that constitutes the external electrode 11 may be applied in multiple layers and then baked at once, or a single layer may be baked. For the reason of convenience in mass production, it is preferable that multiple layers are formed and then baked at once. When the layers having different contents of the glass component are to be formed, the layers may be formed while varying the quantity of the glass component included in each layer one by one. When it is necessary to form a very thin glass-rich layer in contact with the piezoelectric layer 5, a glass-rich paste may be printed on the stack 9 by screen printing process or the like, and the multiple sheets may be stacked thereon.

Then the multi-layer piezoelectric element 1 formed as described above is housed in a cylindrical case made of a metal such as stainless steel, and the space between the case and the multi-layer piezoelectric element 1 is filled with a filling material such as silicone resin which forms an insulation layer. At this time, such a procedure may also be employed as the multi-layer piezoelectric element 1 is placed in a cylindrical jig which is then filled with a resin, the multi-layer piezoelectric element 1 coated with the resin is then taken out of the jig and is put into the cylindrical case made of metal.

The case is then sealed with the lid. While sealing may be carried out by bonding by means of adhesive, soldering or brazing, welding is preferable for the reason of high durability. In this case, a plurality of holes may be drilled in the side face of the cylindrical case, in which case the case acts like a spring so that such a piezoelectric actuator unit is obtained as the multi-layer piezoelectric element 1 is subjected to compressive stress in the stacking direction, when the lid is welded.

Then a DC voltage from 0.1 to 3 kV/mm is applied between the pair of external electrodes 11 via lead wires which are connected to the external electrodes 11 so as to apply polarization treatment to the element 1. This causes the piezoelectric actuator unit incorporating the element 1 to expand with the stress generated thereby acting on the stress relieving layer 7b. As a result, among the plurality of partial metal layers 71 that are scattered throughout the entire region between two piezoelectric layers 5, a part where higher stress is concentrated peels off the adjacent piezoelectric layer 5 so as to form a peel-off section (slit). Since the stress is most likely concentrate in the side face of the element 1, the partial metal layers 71 located on the side face of the element 1 peel off the piezoelectric layer 5, so as to form such a peel-off section as shown in FIG. 3. Application of the polarization reversal treatment, in particular, can cause expansion and shrinkage of the element 1 to occur violently in a short time, and therefore the peel-off section 15 can be formed effectively.

At this time, in case the polarization treatment is carried out without placing the multi-layer piezoelectric element 1 in the case, the multi-layer piezoelectric element 1 is not held sufficiently when the multi-layer piezoelectric element 1 expands. As a result, the multi-layer piezoelectric element 1 is not able to expand without deviation in the stacking direction in accordance to the misalignment of stacking between the internal electrode layers 7a and to the variation in the insulation distance on the side face of the element. Thus strain occurs in the direction of expansion and it becomes impossible to control the stress generated in the side face of the element 1, eventually resulting in cracks in the piezoelectric layer 5. When the multi-layer piezoelectric element 1 is housed in the case, in contrast, expansion of the multi-layer piezoelectric element 1 can be restricted within the stacking direction, and it is made possible to control so that the peel-off section 15 is formed only in the stress relieving layer 7b that consists of the plurality of partial metal layers 71 which are scattered throughout the entire region between two piezoelectric layers 5. When the case is rendered with the property of spring, in particular, the piezoelectric actuator unit can expand only when the tensile stress excels the compressive stress as the compressive stress is generated in counter to the expansion. Accordingly, since the stress relieving layer 7b consisting of the plurality of partial metal layers 71 which are scattered throughout the entire region between two piezoelectric layers 5 does not function as the internal electrode, the surrounding piezoelectric layers 5 do not contribute to the expansion so that compressive stress is concentrated therein, unlike the piezoelectric layers 5 which expand, thus resulting in the formation of peel-off section 15.

Moreover, a wiring comprising mesh- or comb-shaped metal may be joined onto the outer surface of the external electrodes 11 by means of an electrically conductive adhesive or by soldering. Such a wiring allows it to flow a large current in the vicinity of the internal electrode and decrease the current flowing in the external electrodes 11, when the actuator is operated at a high speed by supplying a large current. Accordingly, it is made possible to prevent the external electrodes 11 from undergoing wire breakage due to local heating, thus greatly improving the durability.

The electrically conductive particles are more preferably non-spherical particles having such shapes as flakes or acicular particles. When the electrically conductive particles are non-spherical particles such as flakes or acicular particles, the electrically conductive particles can be firmly entwined with each other, thereby increasing the shear strength of the electrically conductive adhesive.

While one embodiment of the present invention has described, the multi-layer piezoelectric element 1 of the present invention is not limited to the embodiment described above, and various modifications can be made within the scope of the present invention.

For example, while all the metal layers are made of alloy in the embodiment described above, such a constitution may also be employed as part of the metal layers is formed from an alloy and the rest is formed from a metal element. While the metal layers include the same components in the embodiment described above, the metal layers may also consist of layers of two or more kinds which include different elements as the main components.

As will be apparent from the foregoing description, the piezoelectric actuator unit of this embodiment is capable of not only obtaining a large amount of displacement but also maintaining high reliability even when the multi-layer piezoelectric element 1 is subjected to a transient surge voltage due to a noise in the power source, or the piezoelectric actuator unit is operated continuously over a long period of time under conditions of high temperature, high humidity, high electric field and a high pressure.

Figure 5A:
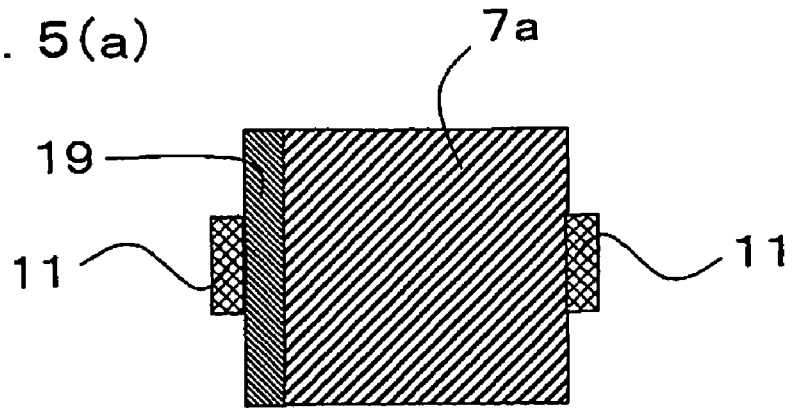
FIG. 5(a) is a sectional view in a plane including the internal electrode layer which adjoins on one side of the stacking direction of the stress relieving layer in another embodiment of the present invention.
Figure 5B:
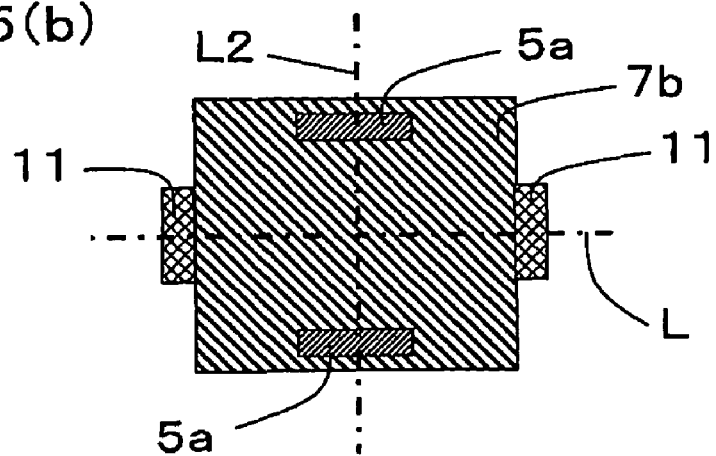
FIG. 5(b) is a sectional view in a plane which includes the stress relieving layer in this embodiment.
Figure 5C:
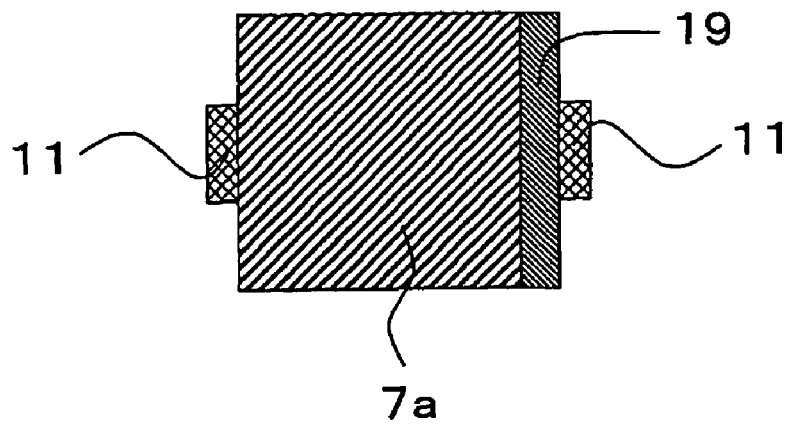
FIG. 5(c) is a sectional view in a plane including the internal electrode layer which adjoins on the other side of the stacking direction of the stress relieving layer in this embodiment.

FIG. 5(a) is a sectional view in a plane including the internal electrode layer 7a which adjoin on one side of the stacking direction of the stress relieving layer 7b in another embodiment of the present invention, FIG. 5(b) is a sectional view in a plane which includes the stress relieving layer 7b in this embodiment, and FIG. 5(c) is a sectional view in a plane including the internal electrode layer 7a which adjoin on the other side of the stacking direction of the stress relieving layer 7b in this embodiment. FIGS. 6 to 10 are sectional views showing other embodiments of the present invention, in a similar manner to FIG. 5. As indicated by these embodiments, there are no limitations on the places, number, shapes and other properties of the junction sections 5a, and various configurations may be employed.

<Injection Apparatus>

Figure 12:
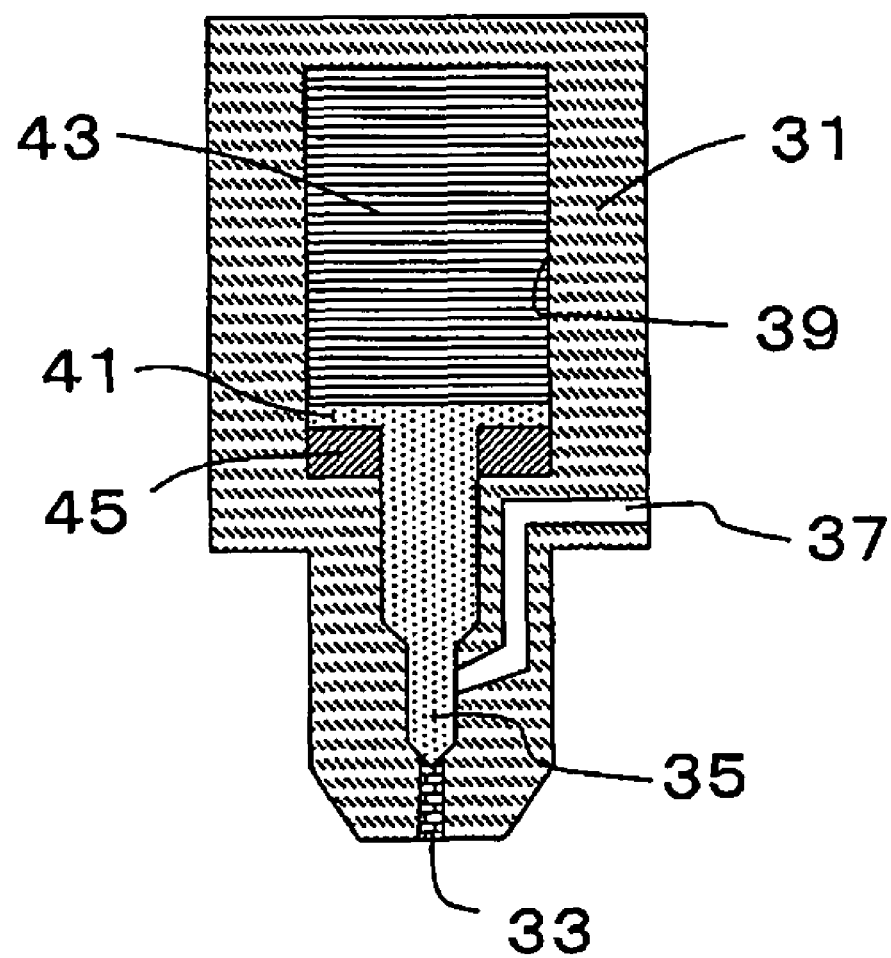
FIG. 12 is a sectional view schematically showing the injection apparatus according to the embodiment of the present invention.
Figure 13A:
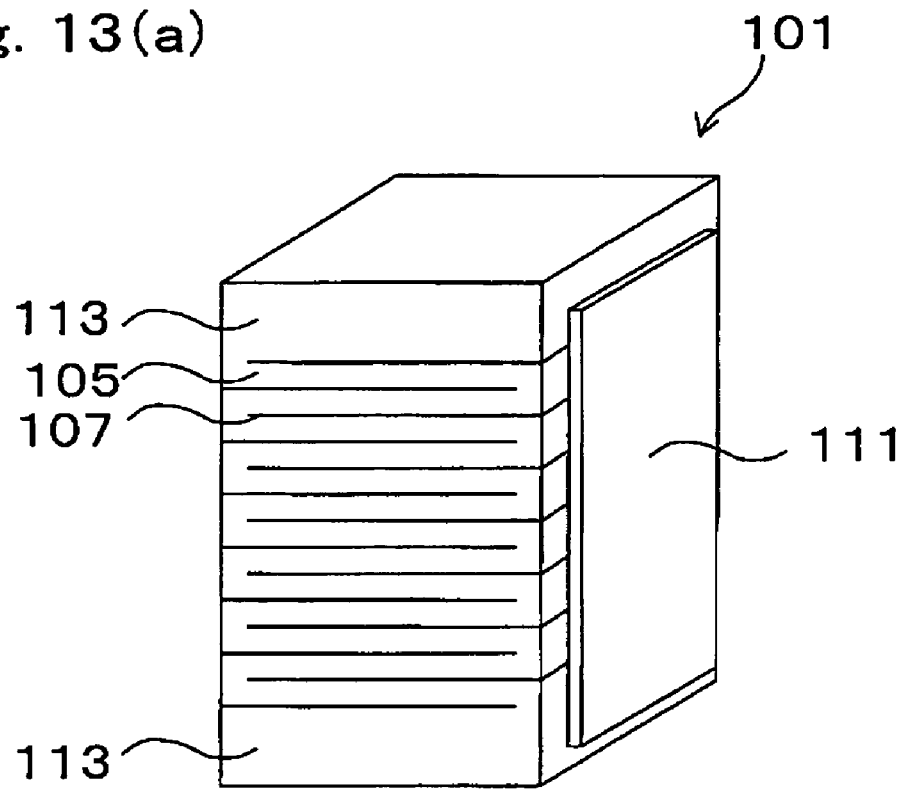
FIG. 13(a) is a perspective view showing the multi-layer piezoelectric element of the prior art.
Figure 13B:
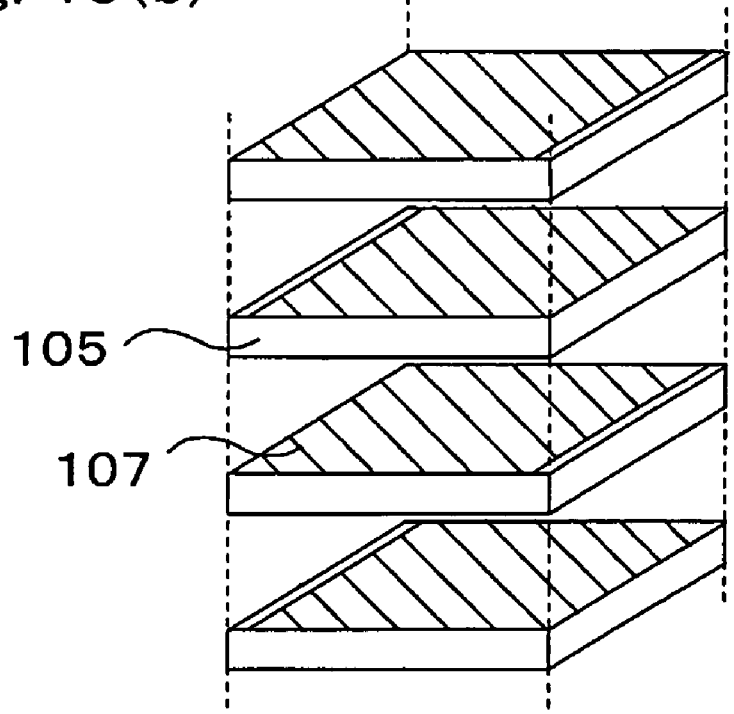
FIG. 13(b) is an exploded perspective view of a part of the multi-layer piezoelectric element explanatory of the internal structure of the multi-layer piezoelectric element shown in FIG. 13(a).

FIG. 12 is a sectional view schematically showing an injection apparatus according to one embodiment of the present invention. As shown in FIG. 12, the injection apparatus of this embodiment comprises a piezoelectric actuator unit 43 of the present invention exemplified by the embodiment described above being housed in a container 31 which has an injection hole 33 formed at one end thereof. Disposed in the container 31 is a needle valve 35 which is capable of opening and closing the injection hole 33. The injection hole 33 is provided with a fuel passage 37 disposed so as to communicate therewith in accordance to the movement of the needle valve 35. The fuel passage 37 is connected to a fuel source that is provided outside of the apparatus, so as to receive a fuel supplied thereto at a high pressure that remains always constant. When the needle valve 35 opens the injection hole 33, the fuel that fills the fuel passage 37 is injected at a predetermined level of high pressure into a fuel chamber of an internal combustion engine (not shown).

The needle valve 35 has an enlarged top portion where the inner diameter is made larger. A cylinder 39 of the container 31 has the piezoelectric actuator unit 43, provided with the multi-layer piezoelectric element 1, housed therein. Disposed at the bottom end of the unit 43 is a piston 41 which makes sliding motion with respect to the cylinder 39.

In such an injection apparatus, when the piezoelectric actuator unit 43 expands in response to a voltage applied thereto, the piston 41 is pressed so that the needle valve 35 plugs the injection hole 33, thereby stopping the supply of fuel. When the voltage is removed, the piezoelectric actuator unit 43 shrinks and a Belleville spring 45 pushes back the piston 41, so that the injection hole 33 communicates with the fuel passage 37 and the fuel is discharged.

The present invention relates to the piezoelectric actuator unit, although the present invention is not limited to the embodiment described above, and various modifications can be made within the scope of the present invention. The piezoelectric actuator unit of the present invention can be used in, for example, fuel injection apparatus of automobile engine, liquid injection apparatus of ink jet printer or the like or a drive unit used in precision positioning device or vibration preventing device for an optical apparatus, sensor element mounted in combustion pressure sensor, knocking sensor, acceleration sensor, load sensor, ultrasound sensor, pressure sensor, yaw rate sensor or the like, or used as a circuit component mounted in piezoelectric gyro, piezoelectric switch, piezoelectric transducer, piezoelectric breaker or the like, as long as the piezoelectric property is utilized.

EXAMPLE

The present invention will now be described in more detail by way of examples. First, a calcined powder of a piezoelectric ceramic material constituted from lead titanate zirconate ($PbZrO_3$—$PbTiO_3$) having mean particle size of 0.4 μm as the main component, a binder and a plasticizer were mixed to form a slurry which was formed into ceramic green sheets that would become the piezoelectric layers 5 having thickness of 100 μm after firing by the doctor blade process.

An electrically conductive paste, prepared by adding a binder to the alloy consisting mainly of silver-palladium so as to have the composition shown in Table 1, was applied to one side of the ceramic green sheet by screen printing method. Then 300 pieces of the ceramic green sheets were stacked and fired at a temperature of 1000° C. for 2 hours after holding the temperature at 800° C. for 2 hours.

When a DC voltage of 150 V was applied to the multi-layer piezoelectric element, all piezoelectric actuator units showed displacements in the stacking direction.

Then an AC voltage of 150 Hz from 0 to +150 V was applied to the piezoelectric actuator unit at the room temperature, to carry out continuous operation of $1 \times 10^9$ cycles.

Results of the test are shown in Table 1.

TABLE 1

Figure 6A:
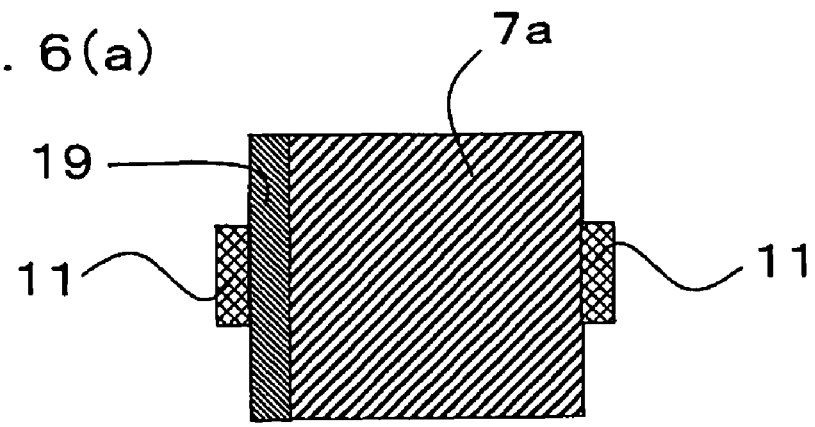
FIG. 6(a) is a sectional view in a plane including the internal electrode layer which adjoins on one side of the stacking direction of the stress relieving layer in further another embodiment of the present invention.
Figure 6B:
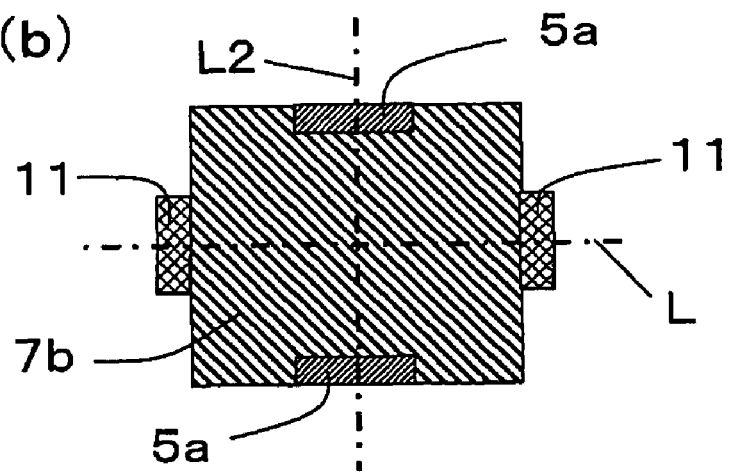
FIG. 6(b) is a sectional view in a plane which includes the stress relieving layer in this embodiment.
Figure 6C:
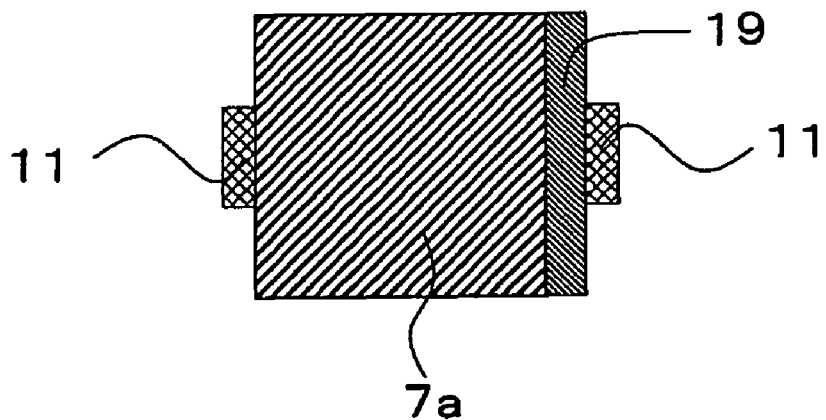
FIG. 6(c) is a sectional view in a plane including the internal electrode layer which adjoins on the other side of the stacking direction of the stress relieving layer in this embodiment.
Figure 7A:
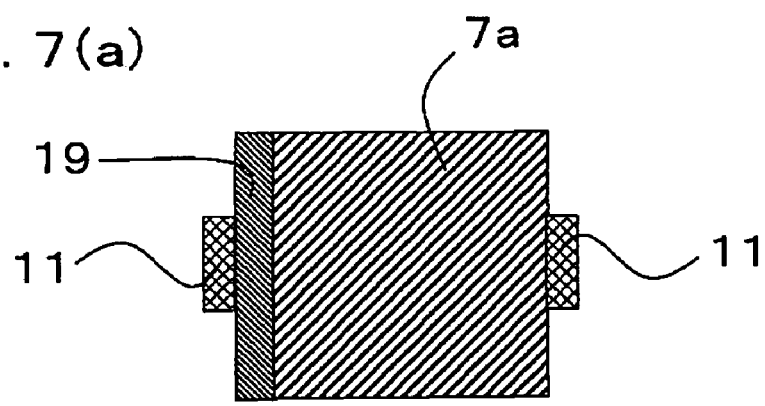
FIG. 7(a) is a sectional view in a plane including the internal electrode layer which adjoins on one side of the stacking direction of the stress relieving layer in further another embodiment of the present invention.
Figure 7B:
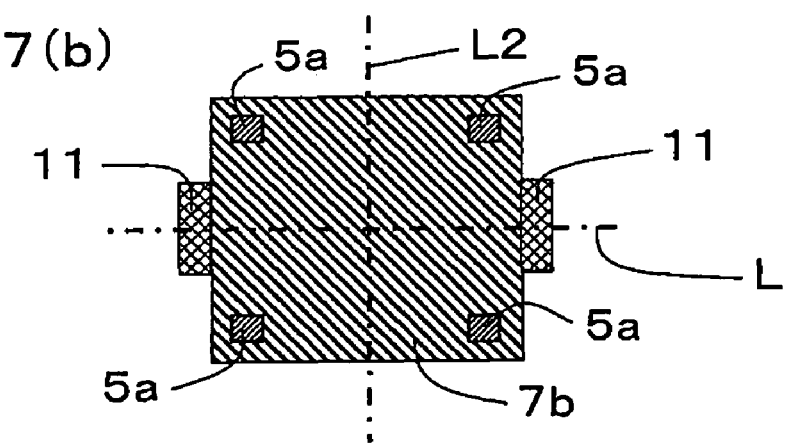
FIG. 7(b) is a sectional view in a plane which includes the stress relieving layer in this embodiment.
Figure 7C:
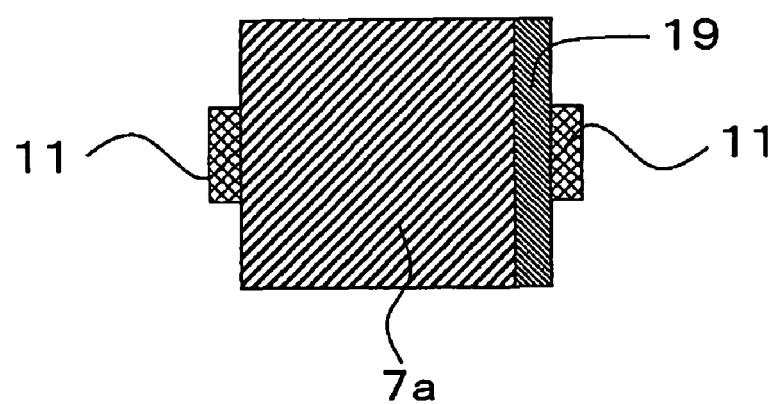
FIG. 7(c) is a sectional view in a plane including the internal electrode layer which adjoins on the other side of the stacking direction of the stress relieving layer in this embodiment.
Figure 8A:
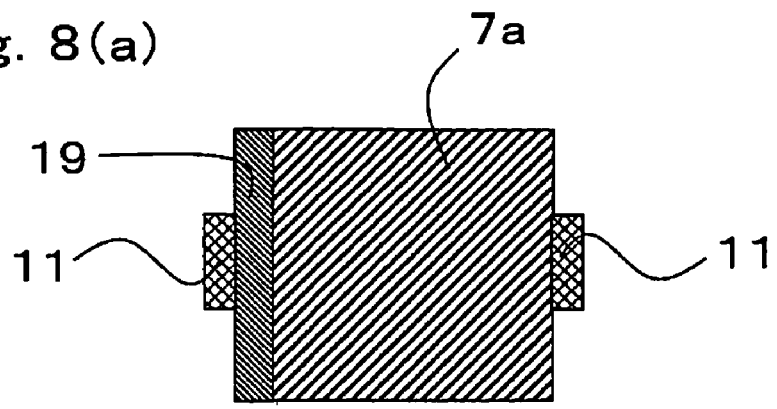
FIG. 8(a) is a sectional view in a plane including the internal electrode layer which adjoins on one side of the stacking direction of the stress relieving layer in further another embodiment of the present invention.
Figure 8B:
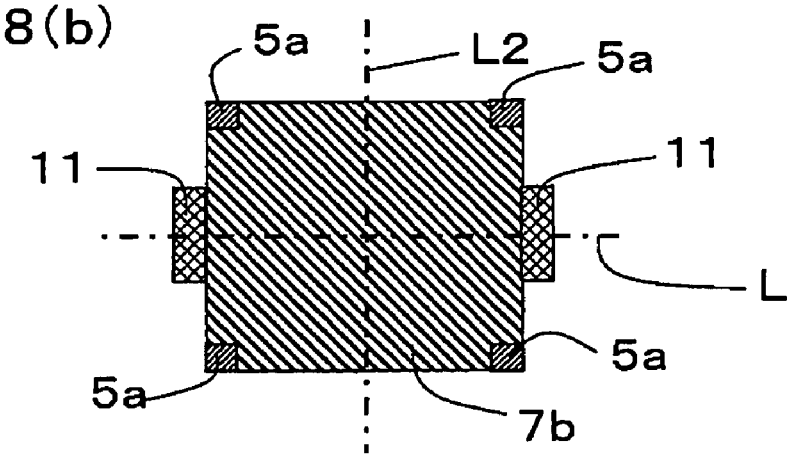
FIG. 8(b) is a sectional view in a plane which includes the stress relieving layer in this embodiment.
Figure 8C:
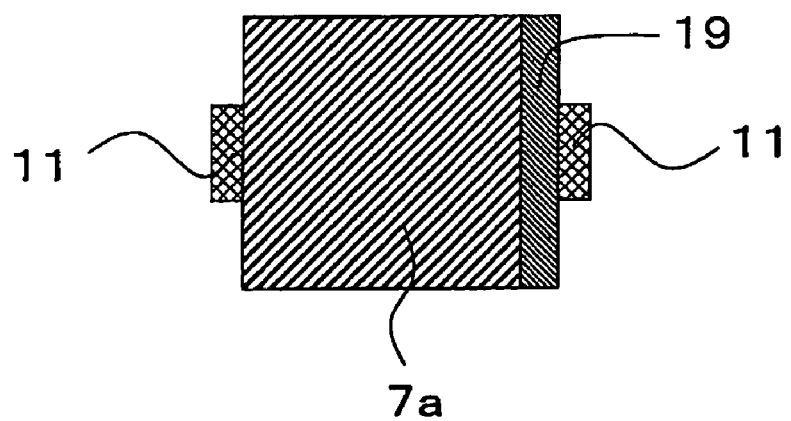
FIG. 8(c) is a sectional view in a plane including the internal electrode layer which adjoins on the other side of the stacking direction of the stress relieving layer in this embodiment.
Figure 9A:
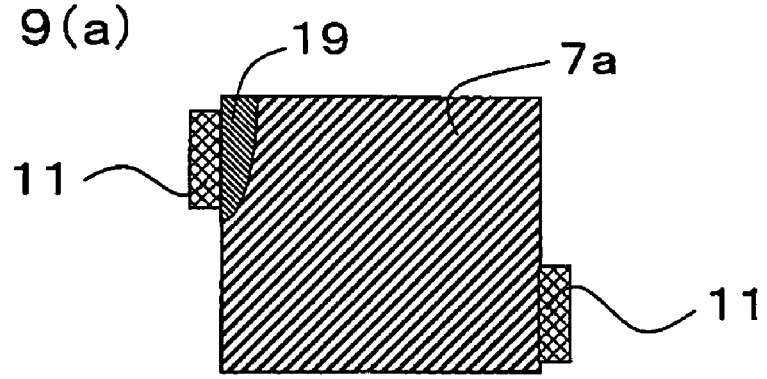
FIG. 9(a) is a sectional view in a plane including the internal electrode layer which adjoins on one side of the stacking direction of the stress relieving layer in further another embodiment of the present invention.
Figure 9B:
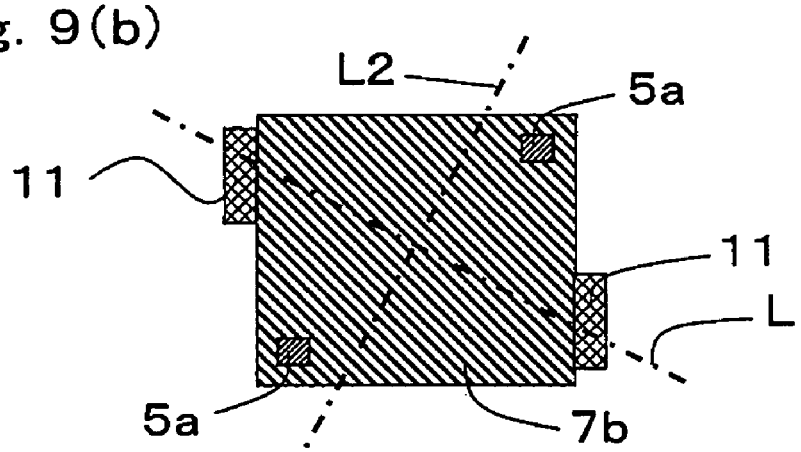
FIG. 9(b) is a sectional view in a plane which includes the stress relieving layer in this embodiment.
Figure 9C:
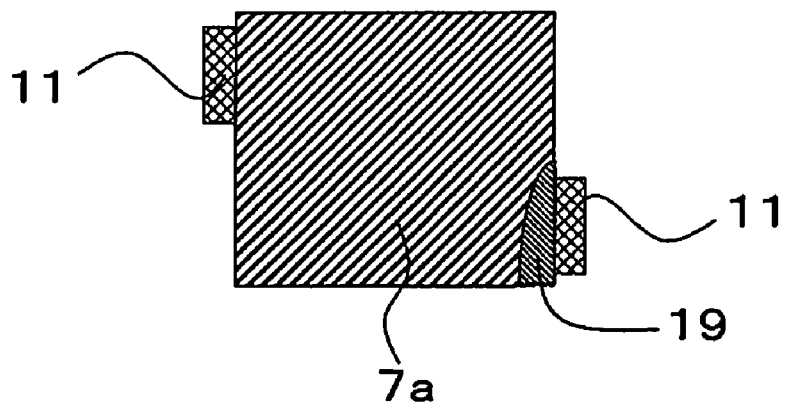
FIG. 9(c) is a sectional view in a plane including the internal electrode layer which adjoins on the other side of the stacking direction of the stress relieving layer in this embodiment.
Figure 10A:
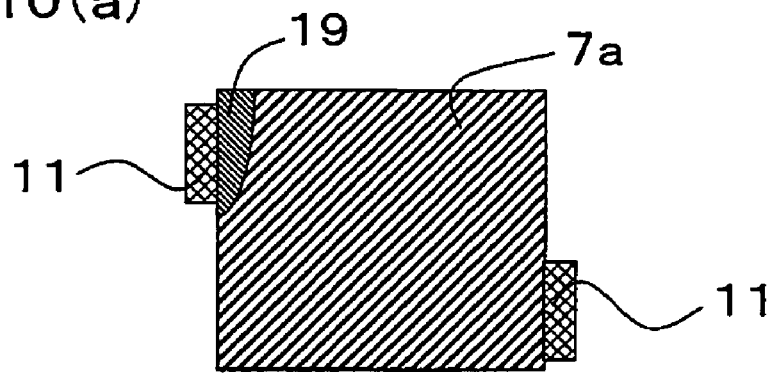
FIG. 10(a) is a sectional view in a plane including the internal electrode layer which adjoins on one side of the stacking direction of the stress relieving layer in further another embodiment of the present invention.
Figure 10B:
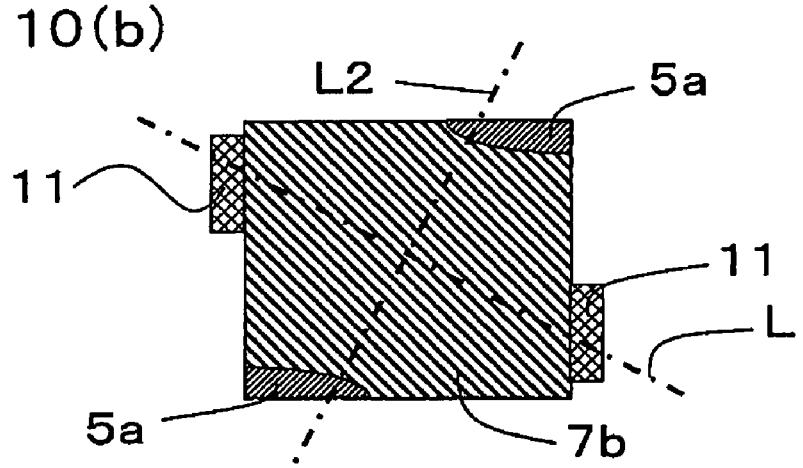
FIG. 10(b) is a sectional view in a plane which includes the stress relieving layer in this embodiment.
Figure 10C:
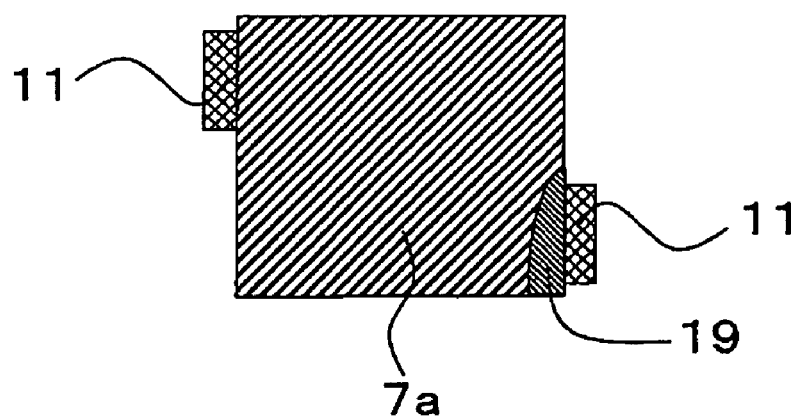
FIG. 10(c) is a sectional view in a plane including the internal electrode layer which adjoins on the other side of the stacking direction of the stress relieving layer in this embodiment.
Figure 11A:
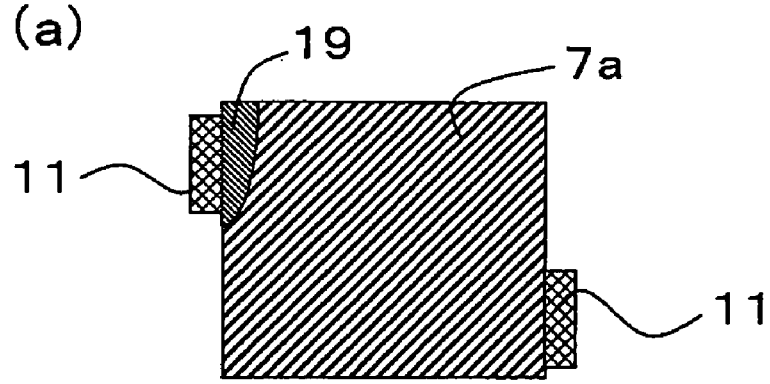
FIG. 11(a) is a sectional view in a plane including the internal electrode layer which adjoins on one side of the stacking direction of the stress relieving layer in a reference example.
Figure 11B:
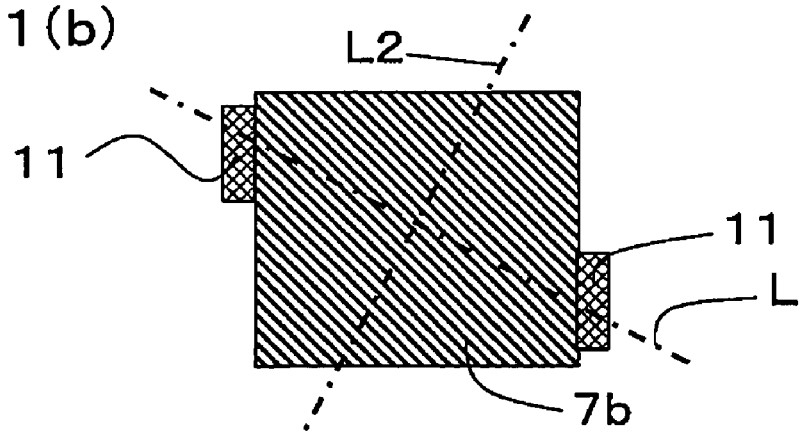
FIG. 11(b) is a sectional view in a plane which includes the stress relieving layer in this reference example.
Figure 11C:
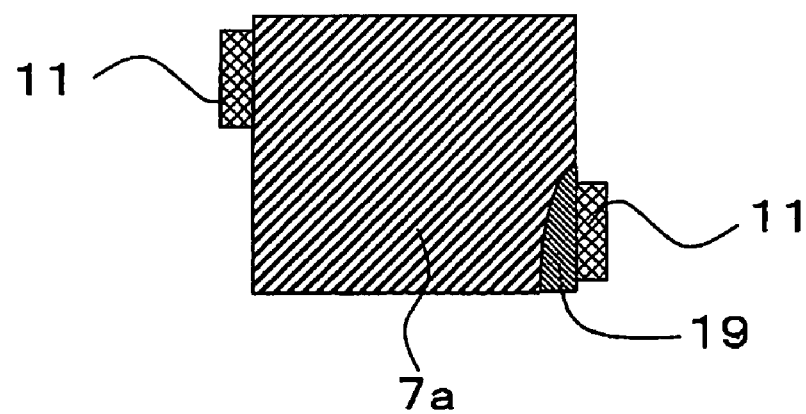
FIG. 11(c) is a sectional view in a plane including the internal electrode layer which adjoins on the other side of the stacking direction of the stress relieving layer in this reference example.

| No | Constitution of internal electrode layer and stress relieving layer | Compositions of metal layer 12 (% by weight) | Compositions of metal layer 12b (% by weight) | Displacement in initial state (μm) | Displacement after continuous operation of ($1 \times 10^9$ cycles) (μm) | Presence of crack penetrating piezoelectric layer in thickness direction |
|---|---|---|---|---|---|---|
| 1 | FIG. 5 | Ag70% Pd30% | Ag75% Pd25% | 45.0 | 44.9 | No |
| 2 | FIG. 6 | Ag70% Pd30% | Ag75% Pd25% | 44.5 | 44.4 | No |
| 3 | FIG. 7 | Ag80% Pd20% | Ag85% Pd15% | 50.0 | 49.9 | No |
| 4 | FIG. 8 | Ag80% Pd20% | Ag85% Pd15% | 49.5 | 49.4 | No |
| 5 | FIG. 9 | Ag90% Pd10% | Ag95% Pd5% | 55.0 | 55.0 | No |
| 6 | FIG. 10 | Ag90% Pd10% | Ag95% Pd5% | 54.5 | 54.4 | No |
| 7 | FIG. 9 | Ag95% Pd5% | Ag98% Pd2% | 60.0 | 60.0 | No |
| 8 | FIG. 10 | Ag95% Pd5% | Ag98% Pd2% | 59.9 | 59.9 | No |
| 9 | FIG. 11 | Ag70% Pd30% | Ag85% Pd15% | 46.0 | 44.0 | No |
| 10 | No stress relieving layer | Ag80% Pd20% | No | 45.0 | 20.0 | Yes |

In the portion where the stress relieving layers 7b was to be formed, an electrically conductive paste prepared by adding silver in excess to silver-palladium alloy was used, so that silver is included in higher concentration than in the electrically conductive paste of the internal electrode layers 7a which adjoin on both sides of the stacking direction with respect to the electrically conductive paste of the stress relieving layers 7b when the green sheets are stacked. The stress relieving layers 7b constituted from a plurality of partial metal layers (metal particles) being insulated from each other were obtained after firing. The stress relieving layers 7b were disposed in the 50$^{th}$ layer, the 100$^{th}$ layer, the 150$^{th}$ layer, the 200$^{th}$ layer and the 250$^{th}$ layer of the stack 9. In the space between the piezoelectric layers 5, 5 where the stress relieving layer 7b was formed, a portion was provided where the electrically conductive paste was not printed on the surface of the green sheet, so that the junction section 5a was formed.

Then a mixture of silver powder of flake-like particles having mean particle size of 2 μm and amorphous glass powder having softening point of 640° C. including silicon having mean particle size of 2 μm as the main component was mixed with 8 weight parts of binder in proportion to 100 weight parts in total of silver powder and glass powder, so as to prepare the electrically conductive silver-glass paste by fully mixing the powders. The electrically conductive silver-glass paste thus prepared was printed onto to external electrodes 15 of the stack 13, and was baked at 700° C. for 30 minutes thereby to form the external electrodes 15.

Then with lead wires connected to the external electrodes 15, a DC electric field of 3 kV/mm was applied between the positive and negative external electrodes 15 via the lead wires for 15 minutes so as to apply polarization treatment, thereby completing the piezoelectric actuator using the multi-layer piezoelectric element 1 as shown in FIG. 1.

As shown in Table 1, sample No. 10 made as the comparative example without forming the stress relieving layer showed a small amount of displacement due to the stress concentrated in the interface between the internal electrode layer and the piezoelectric layer, which resulted in a crack that penetrated the piezoelectric material between the internal electrodes.

Samples Nos. 1 to 9 having the stress relieving layers 7b formed therein, in contrast, showed effective amount of displacement required for a piezoelectric actuator unit without significant decrease in the amount of displacement after continuous operation of $1 \times 10^9$ cycles, and piezoelectric actuator unit having high durability was made.

The invention claimed is:

1. A multi-layer piezoelectric element comprising:
a stack having a plurality of piezoelectric layers and a plurality of metal layers, the piezoelectric layers and the metal layers being stacked one on another;
a pair of external electrodes formed on the side faces of the stack,
wherein at least one of the plurality of metal layers is a stress relieving layer having a plurality of partial metal layers and voids, the partial metal layers are scattered between two piezoelectric layers sandwiching the stress relieving layer in the direction of stacking, and
wherein a plurality of junction sections are formed between said two piezoelectric layers to join said two piezoelectric layers with each other, the junction sections being disposed on both sides of an imaginary straight line which is drawn so as to connect the center in the direction of width of one of the external electrodes and the center in the direction of width of the other of the external electrodes in a plane that includes the stress relieving layer and is perpendicular to the stacking direction.

2. The multi-layer piezoelectric element according to claim 1, wherein the pair of external electrodes are disposed at the position where the plane is divided into two equal parts by the imaginary straight line.

3. The multi-layer piezoelectric element according to claim 2, wherein the junction sections are disposed along a straight line which is perpendicular to the imaginary straight line and passes the center of the imaginary straight line.

4. The multi-layer piezoelectric element as in claim 1, wherein the junction sections are disposed along the side faces of the stack.

5. The multi-layer piezoelectric element as in claim 1, wherein the plurality of partial metal layers are separated by the voids so as to be electrically insulated from each other.

6. The multi-layer piezoelectric element as in claim 1, wherein the stress relieving layer is disposed in plurality in the stacking direction of the stack.

7. The multi-layer piezoelectric element according to claim 6, wherein the plurality of stress relieving layers are disposed via a plurality of piezoelectric layers.

8. The multi-layer piezoelectric element according to claim 6, wherein the plurality of stress relieving layers are disposed in regular arrangement in the stacking direction of the stack.

9. The multi-layer piezoelectric element according to claim 1, wherein the stress relieving layer is constituted mainly from silver.

10. An injection apparatus comprising a container which has an injection hole and the multi-layer piezoelectric element described in claim 1, wherein a liquid held in the container is discharged from the injection hole by the operation of the multi-layer piezoelectric element.

* * * * *